United States Patent [19]
Alwan

[11] Patent Number: 5,811,020
[45] Date of Patent: Sep. 22, 1998

[54] NON-PHOTOLITHOGRAPHIC ETCH MASK FOR SUBMICRON FEATURES

[75] Inventor: James J. Alwan, Boise, Id.

[73] Assignee: Micron Technology, Inc., Boise, Id.

[21] Appl. No.: 900,368

[22] Filed: Jul. 23, 1997

Related U.S. Application Data

[63] Continuation of Ser. No. 614,778, Mar. 7, 1996, Pat. No. 5,695,658.

[51] Int. Cl.⁶ .................................................. H01L 21/302
[52] U.S. Cl. .................................. 216/42; 216/11; 216/49
[58] Field of Search .............................. 216/11, 42, 47, 216/49

[56] References Cited

U.S. PATENT DOCUMENTS

| | | | |
|---|---|---|---|
| 3,665,241 | 5/1972 | Spindt et al. | 313/351 |
| 3,755,704 | 8/1973 | Spindt et al. | 313/309 |
| 3,812,559 | 5/1974 | Spindt et al. | 29/25.18 |
| 3,814,968 | 6/1974 | Nathanson et al. | 313/95 |
| 4,407,695 | 10/1983 | Deckman et al. | 156/643 |
| 4,513,308 | 4/1985 | Greene et al. | 357/55 |
| 4,566,935 | 1/1986 | Hornbeck | 156/626 |
| 4,685,996 | 8/1987 | Busta et al. | 156/628 |
| 4,766,340 | 8/1988 | Van der Mast et al. | 313/366 |
| 4,806,202 | 2/1989 | Tang et al. | 156/657 |
| 4,940,916 | 7/1990 | Borel et al. | 313/306 |
| 4,968,382 | 11/1990 | Jacobson et al. | 156/643 |
| 4,992,699 | 2/1991 | McClure et al. | 156/647 X |
| 5,064,396 | 11/1991 | Spindt et al. | 445/50 |
| 5,083,958 | 1/1992 | Longo et al. | 156/644 X |
| 5,186,670 | 2/1993 | Doan et al. | 445/24 |
| 5,201,992 | 4/1993 | Marcus et al. | 156/643 |
| 5,220,725 | 6/1993 | Chan et al. | 29/874 |
| 5,221,221 | 6/1993 | Okaniwa | 156/657 X |
| 5,228,877 | 7/1993 | Allaway et al. | 156/659.1 X |
| 5,229,171 | 7/1993 | Donovan et al. | 427/483 |
| 5,229,331 | 7/1993 | Doan et al. | 437/228 |
| 5,266,530 | 11/1993 | Bagley et al. | 156/651 X |
| 5,302,238 | 4/1994 | Roe et al. | 156/643 |
| 5,391,259 | 2/1995 | Cathey et al. | 156/643 |
| 5,411,630 | 5/1995 | Nagase et al. | 216/22 |
| 5,510,156 | 4/1996 | Zhao | 427/534 |

OTHER PUBLICATIONS

K. Kim and C.K. Ryu, "Generation of Charged Liquid Cluster Beam of Liquid–Mix Precursors and Application to Nanostructured Materials", Nanostructured Materials, vol. 4, No. 5, pp. 597–602, 1994.

Marcus et al., "Formation of Silicon Tips with 1 nm Radius", Appl. Physics Letter, vol. 56, No. 3, Jan. 15, 1990 pp. 236–238.

Hunt et al., "Structure and Electrical Characteristics of Silicon Field–Emission Microelectronic Devices", IEEE Transactions on Electron Devices, vol. 38, No. 10, Oct. 1991 pp. 2309–2313.

McGruer et al., "Oxidation–Sharpened Gated Field Emitter Array Process", IEEE Transactions on Electron Devices, vol. 38, No. 10, Oct. 1991 pp. 2389–2391.

R.Z. Bakhitzin et al., "GaAs Field Emitter Array", IEEE Transactions on Electron Devices, vol. 8, No. 10, Oct. 1991, pp. 2398–2400.

R.N. Thomas et al., "Fabrication and Some Applications of Large–Area Silicon Field Emission Arrays", Solid–State Electronics, vol. 17, 1974, pp. 155–163.

*Primary Examiner*—Robert Kunemund
*Assistant Examiner*—Anita Alanko

[57] ABSTRACT

A non-photlithographic, physical patterning process, which is useful for selectively etching of a substrate, is provided. The process comprises electrostatically charging liquid droplets which are selectively etchable with respect to the substrate, dispersing the droplets onto substrate in a pattern; and etching the substrate using the droplets as a mask.

17 Claims, 8 Drawing Sheets

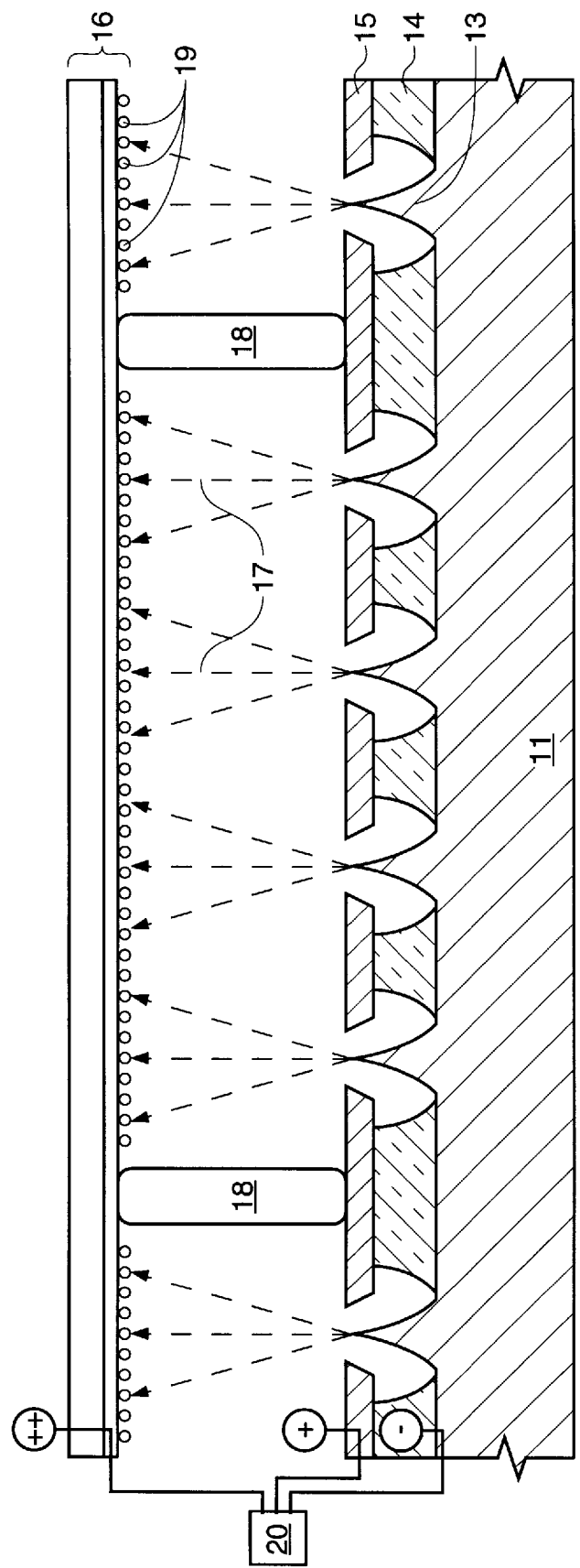

NON-PHOTOLITHOGRAPHIC ETCH MASK FOR SUBMICRON FEATURES

This application is a continuation of application Ser. No. 08/614,778, filed Mar. 7, 1996 now U.S. Pat. No. 5,695,658.

CROSS-REFERENCE TO RELATED APPLICATIONS

The present application is related to U.S. Pat. No. 5,302,239, issued on Apr. 12, 1994, entitled, "Method of making Atomically Sharp Tips useful in Scanning Probe Microscopes," assigned to Micron Technology, Inc. and U.S. application Ser. No. 08/184,819, filed on Jan. 21, 1994 now U.S. Pat. No. 5,391,259, which is a continuation-in-part of U.S. Pat. No. 5,302,238, issued Apr. 12, 1994, entitled, "Plasma Dry Etch to Produce Atomically Sharp Asperities Useful as Cold Cathodes."

FIELD OF THE INVENTION

This invention relates to masking and patterning technology, and more particularly to liquid dispersions for use as non-photolithographic etch masks for submicron features.

BACKGROUND OF THE INVENTION

In the semiconductor industry, patterning is typically accomplished by spinning a film of photoresist material onto a wafer. The photoresist is then patterned using a reticle through which light is directed. The exposed portions of the photoresist are developed and the undesired portions are washed away.

However, photolithography using the visible spectrum of light is reaching its manufacturing limits. The $0.25\mu$ feature geometries will require new and aggressive techniques for patterning and masking steps. Currently, there is a great deal of effort being expended to make use of wavelengths in the deep ultra-violet range, as well as the use of x-rays. Phase-shift masks are also being considered as an option for use in photolithography steps.

The development of flat panel displays is also spurring the development of robust patterning processes that can be repeated over large areas in the manufacture of pixels and other features. For example, evacuated displays necessitate spacer structures strong enough to prevent implosion, but patterned small enough to go unnoticed by the human eye. Field emitter displays, in particular, contain multitudes of micro-machined cold cathode emitters which also must be patterned.

Manufacturing environments require processes that produce substantially uniform and stable results. In the manufacture of an array of emitter tips, the tips should be of uniform height, aspect ratio, sharpness, and general shape, with minimum deviation, particularly in the uppermost portion. The inherent sensitivities of and variations in photo patterning reliability compound the problems of etch uniformity.

Fabrication of a uniform array of cathode emitter tips is very difficult to accomplish in a manufacturing environment for a number of reasons. Generally, it is difficult to attain plasma tip etches with uniformities better than 5%. Uniformities of 10%–20% are more commonly achieved. In addition, the oxidation necessary to "sharpen" or point the tip can vary by as much as 20%, thereby increasing the possibility of non-uniformity among the numerous tips in the array. Hence, a highly uniform patterning method is needed to minimize the effects of other process non-uniformities.

The present invention provides the manufacturer with the ability to more directly control or write a pattern of photoresist, thereby eliminating the need for a photolithographic patterning step. The elimination of a photolithographic step is always advantageous, since photo patterning steps are often very expensive, and detract from the robustness of a process due to the limitations imposed by the usable wavelengths of light.

SUMMARY OF THE INVENTION

The process of the present invention can be used to pattern submicron features, such as field emitter tips using a single step (in situ) or multi-step plasma dry etch process. The mask layer is formed such that it exposes the silicon substrate, which silicon substrate is then etched to form the semiconductor feature or field emitter tips.

One advantage of the process of the present invention is that it enables the fabrication of emitter tips having more uniform distribution of tip dimensions. Another advantage is that it enables the formation of a good distribution of extremely sharp points which may be enhanced by further processing, but are enabled functional with etching as a tip formation only. Yet still another advantage is that it can be used with the overetching methods. See, for example, U.S. Pat. No. 5,391,259 entitled "A Method for Forming a Substantially Uniform Array of Sharp Tips."

One aspect of the process of the present invention involves a non-photlithographic, physical patterning process, useful for selectively etching of a substrate. The process comprises electrostatically charging liquid droplets which are selectively etchable with respect to the substrate, dispersing droplets onto substrate in a pattern; and etching the substrate using the droplets as a mask.

Another aspect of the process of the present invention involves a masking process useful in submicron features. An oxide layer is formed superjacent a substrate. The oxide layer is patterned using photoresist droplets, and then the oxide layer is etched.

Yet another aspect of the process of the present invention involves a patterning process useful for fabricating microtips. A first layer is formed superjacent a substrate, and a layer of droplets or micro-drops is placed upon the first layer. The first layer is etched, and the substrate is also etched, thereby fabricating micro-tips.

BRIEF DESCRIPTION OF THE DRAWINGS

The present invention will be better understood from reading the following description of nonlimitative embodiments, with reference to the attached drawings, wherein below:

FIG. 6 is a schematic cross-section of a representative field emission display having micro-tips formed according to the process of the present invention.

DETAILED DESCRIPTION OF THE INVENTION

Figure 1A:
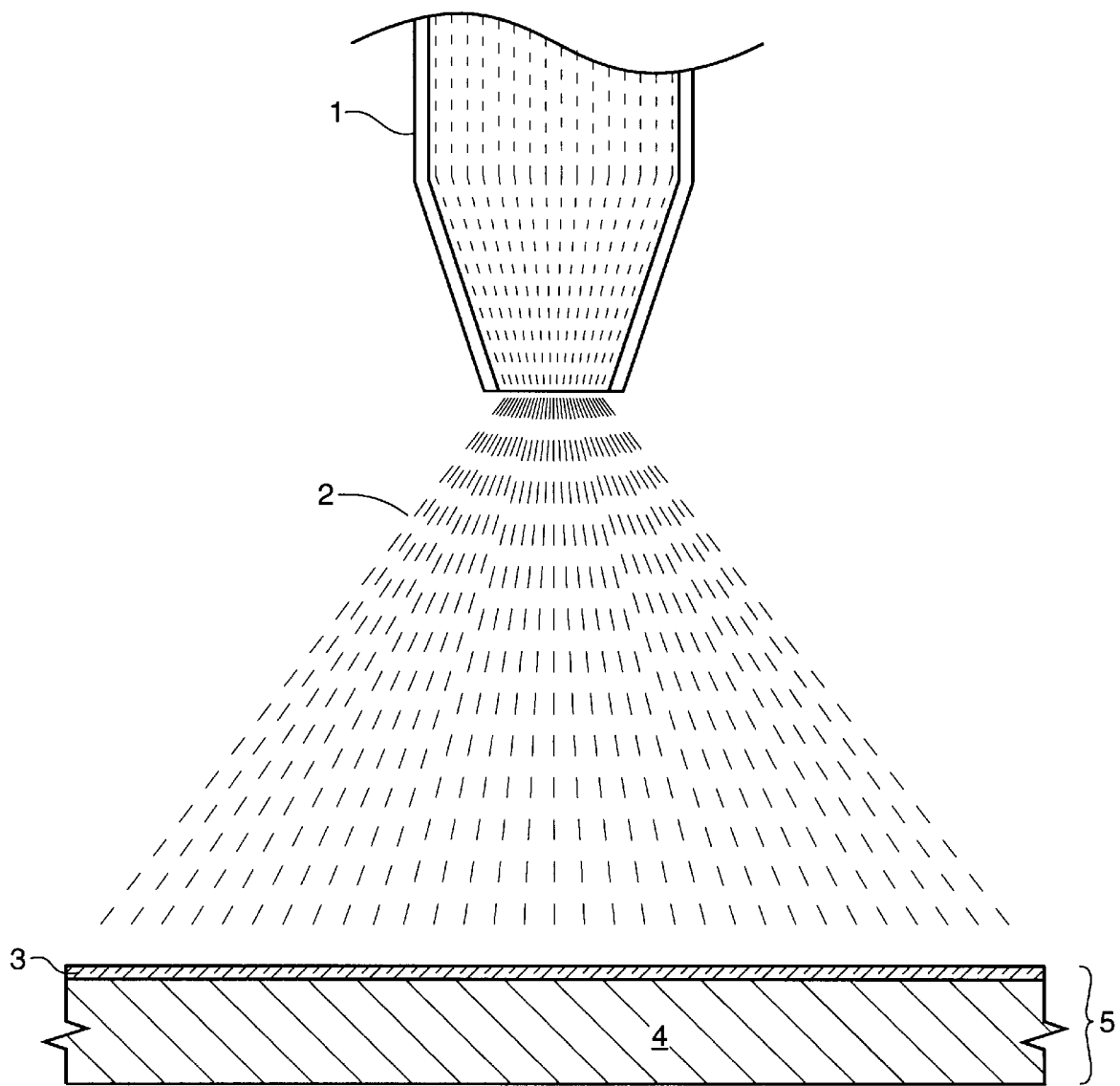
FIG. 1A is a schematic cross-section of a representative atomizer-type dispenser spraying droplets on an etchable substrate, according a first embodiment of the process of the present invention.

The process of the present invention is a non-photolithographic, physical approach to patterning a mask layer. It enables the formation of mask dots or circles having diameters in the range of 1 micron ($\mu$m) or less for use in critical layer lithography. The droplets (also referred to herein as dots, micro-dots, and particles) themselves, can act as the mask, so no further patterning is needed. Hence, the process of the present invention is a physical, rather than photolithographic, masking process.

In one embodiment of the present invention, as shown in FIG. 1, the droplets 2 are preferably generated in the form of an atomized spray 2, and are therefore in liquid form. The dispersion can include, but is not limited to spray streams, jet streams, and other pressure dispersion methods. Liquid dispersants 2 are preferred, but other suspensions containing solids are also contemplated for use in the process of the present invention.

The droplets 2 can be dried during dispersion, thereby forming hardened mask beads having uniform dimensions. The drying results from the ambient into which the liquid droplets 2 are sprayed. Parameters, such as substrate temperature, ambient temperature, evaporation rate of the liquid, and viscosity of the dispersant, affect the drying rate of the droplets 2.

The dispensed droplets 2 are preferably comprised of a photoresist material, either positive or negative. However, the material used for the droplet 2 need only be selectively etchable with respect to the underlying substrate 3, 4, or 5.

For discussion purposes, a multi-layered substrate 5 comprised of at least a mask layer 3 and another layer 4 is shown. However, a single layered substrate 5 is also contemplated within the process of the present invention, for example, layer 3 or layer 4, as long as that layer 3 or 4 is selectively etchable with respect to the droplets 2 dispensed thereon.

Aerosol sprayers 1 propel liquids as a multitude of individual droplets 2. The process of the present invention comprises spraying the photoresist or other masking material in the form of a "monodispersant." Since substantially all of the droplets 2 are of a uniform size, the term "monodispersant" is used. The pressure and size of the nozzle of the atomizer 1 is adjusted until a stream of substantially uniform-sized droplets 2 is achieved.

The droplets 2, pattern the etch mask 3 or alternatively, function as the etch mask, in subsequent etching steps. Hence, the pattern or etch masks 3 formed by the droplets, and therefore the etched underlying structures, will have essentially the same size.

TSI Incorporated of St. Paul, Minn. manufactures several atomizers and aerosol generators useful in the process of the present invention. For example, the Model 3940 Submicrometer Monodisperse Aerosol Generation System can generate drops in a highly monodisperse aerosol in sizes of approximately $0.0005\mu$ to about $1.0\mu$. Additionally, the Electrostatic Classifier, Model 3071A can be used for close control of drop size and dispersion. Vibrating Orifice Aerosol Generator, Model 10352 can also be used to produce droplets.

The spray stream 2 can be directed to those portions of the substrate for which masking is desired. Since the trajectory of the dispersion of the present droplets 2 used in the present invention are controllable, a relatively consistent mean (average) spacing from one droplet to the next is possible. "Overlaps," in which multiple droplets coalesce should occur at a statistically insignificant rate, if the spray stream 2 is properly adjusted.

Both aerosol and other dispersion sprays 2 are useful for this purpose. Since, each droplet 2 serves the role of an individual etch mask, and each droplet has by nature, a uniform circular cross-section, and is uniformly spaced from the other droplets, an essentially uniform array of microstructures can be etched with manufacturing reliablilty. See, for example, FIGS. 5–9.

Figure 2:
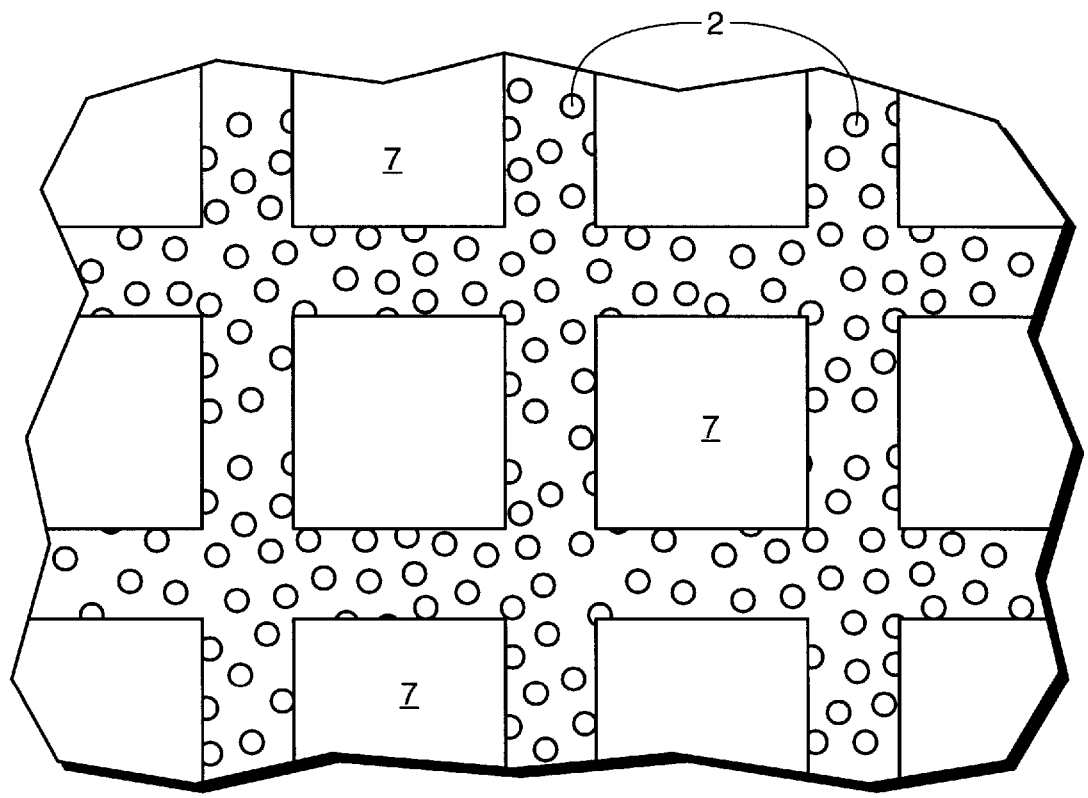
FIG. 2 is a top-view of a photolithographic mask disposed over an array of patterning droplets, according to a third embodiment of the process of the present invention.
Figure 3:
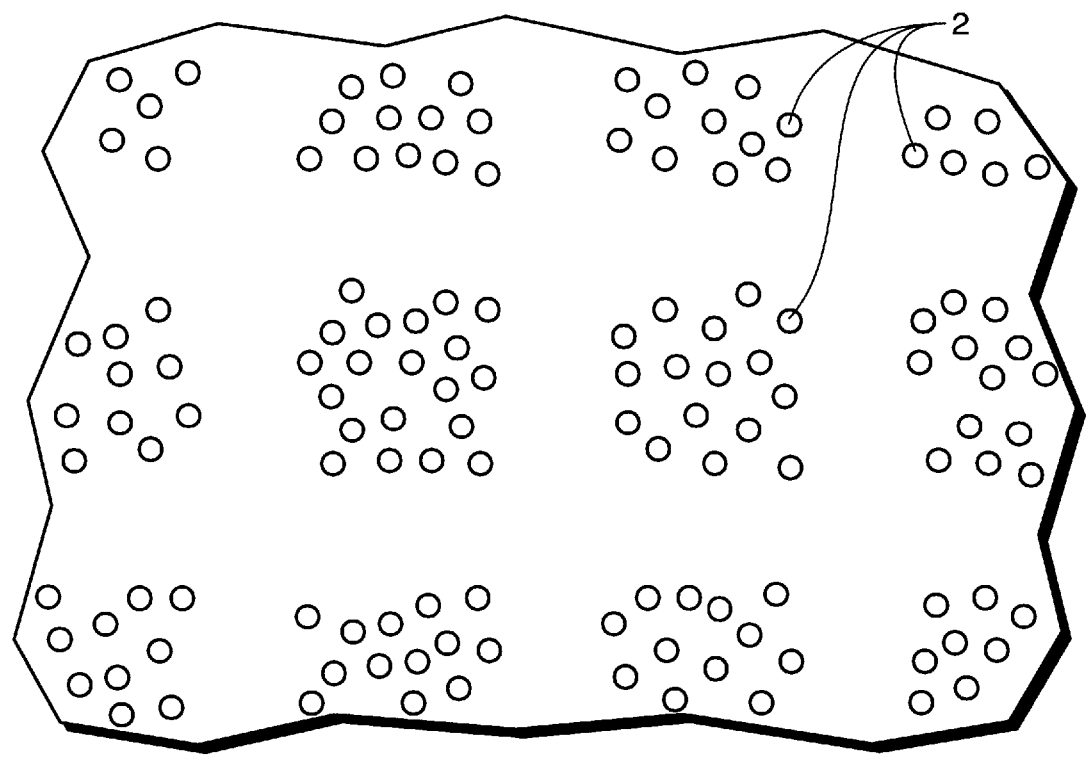
FIG. 3 is a top-view of the array of patterning droplets of FIG. 2, after exposure, according to the process of the present invention.

In another alternative embodiment of the present invention, droplets 2 of positive resist are randomly sprayed over the entire surface of the substrate 4, as shown in FIGS. 1A, 2, and 3. Subsequently, a large geometry (i.e., critical dimensions being greater than 1 $\mu$m.) masking step 6 is undertaken to develop and remove the droplets 2 from the desired locations. The remaining droplets 2 are then used as an etch mask. Similarly, negative resist can be used.

In the above-described embodiment, a photolithography step is undertaken, but the pattern does not have the same fine geometries which would be required for patterning the droplets 2. The large geometry mask 6 has dimensions that do not push the limits of technology, and is used to expose large areas of the substrate 4 at once. See, for example, FIGS. 2–3, in which the large peripheral and inter-array areas are masked 6.

Figure 1B:
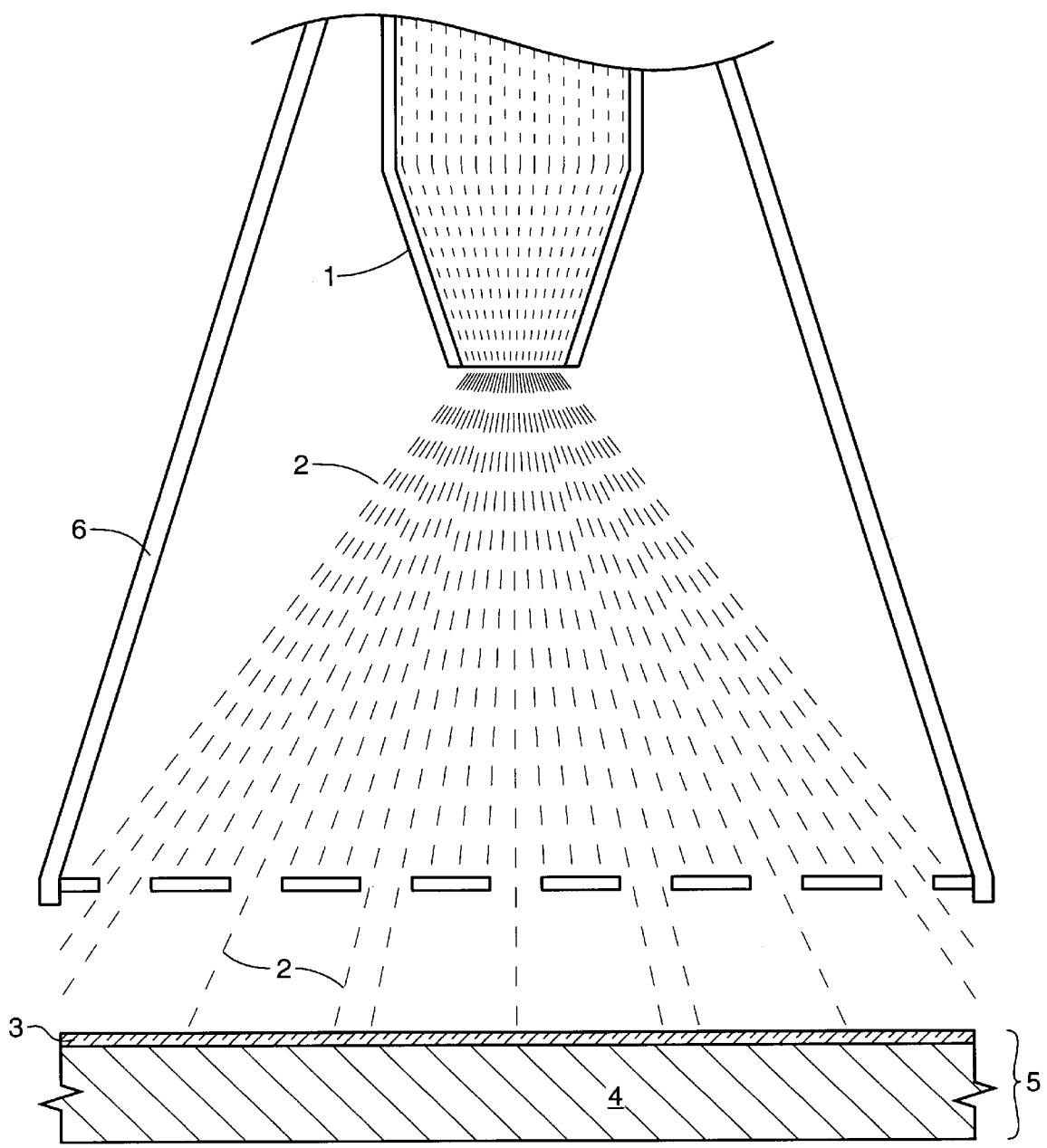
FIG. 1B is a schematic cross-section of the dispenser of FIG. 1A, additionally comprising a shadowmask, according to a second embodiment of the process of the present invention.

Likewise, the droplets 2 can also be sprayed through a shadowmask 7, as shown in FIG. 1B. This achieves a similar result as the large geometry mask 6 described above, without the use of a lithographic step. The shadowmask 7 is aligned to the substrate 5, and the photoresist droplets 2 are thereby physically prevented from landing on the substrate 5 in the covered areas.

Figure 4:
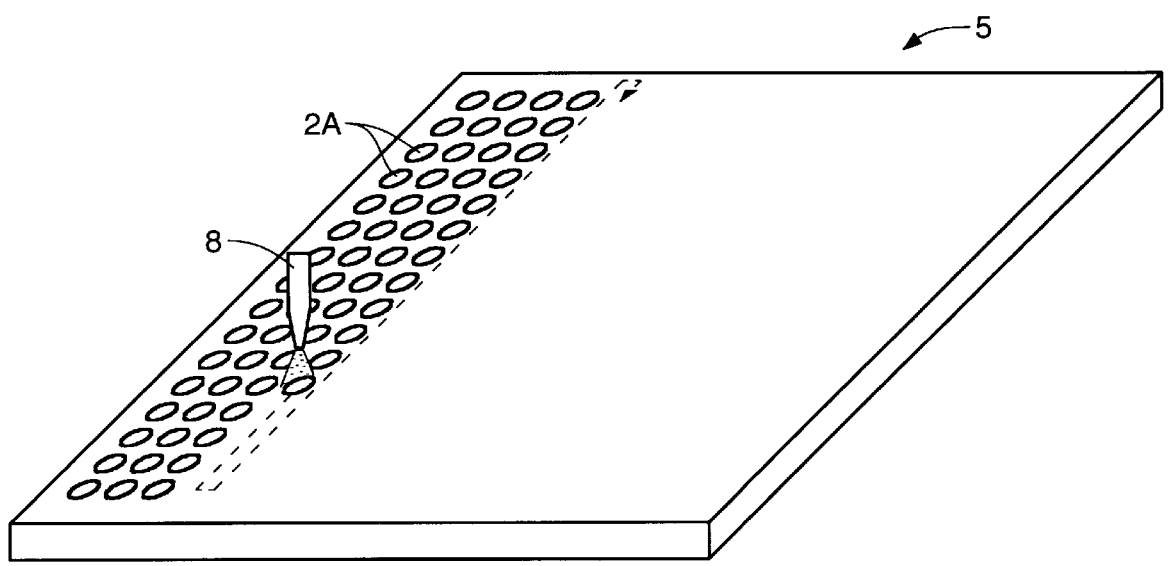
FIG. 4 is a top-view of a substrate onto which droplets are dispensed in a rastering fashion, according to the process of the present invention.

Another embodiment of the process of the present invention comprises the use of a charged liquid cluster beam 2A of photoresist as an etch mask. The charged liquid particles of photoresist 2A are sprayed in a substantially uniform mist over the surface of the wafer or other substrate 5, or directed to "write" a pattern thereon. By moving the dispenser nozzle 8 in relationship to the substrate, the pattern of droplets 2A can be written on the substrate 5, in a raster-like fashion, as shown in FIG. 4.

Using a charged liquid cluster beam, a single droplet 2A at a time can be dispensed upon the substrate 5, adding even greater control to the type of pattern.

Figure 5A:
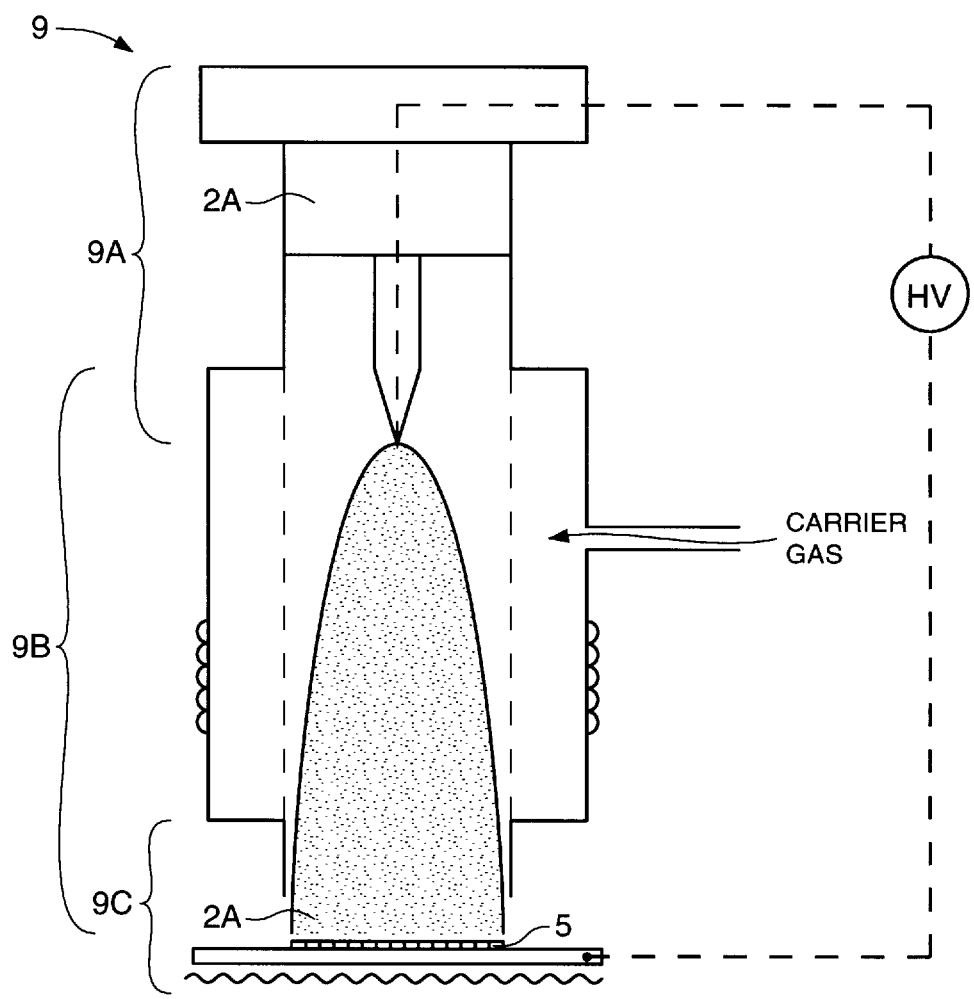
FIGS. 5A and 5B are schematic cross-sections of capillary needles used to charge liquid cluster beams, useful in the process of the present invention.
Figure 5B:
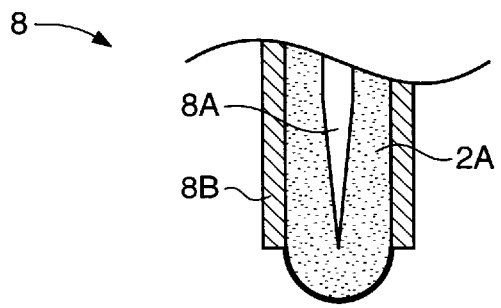
Figure 7:
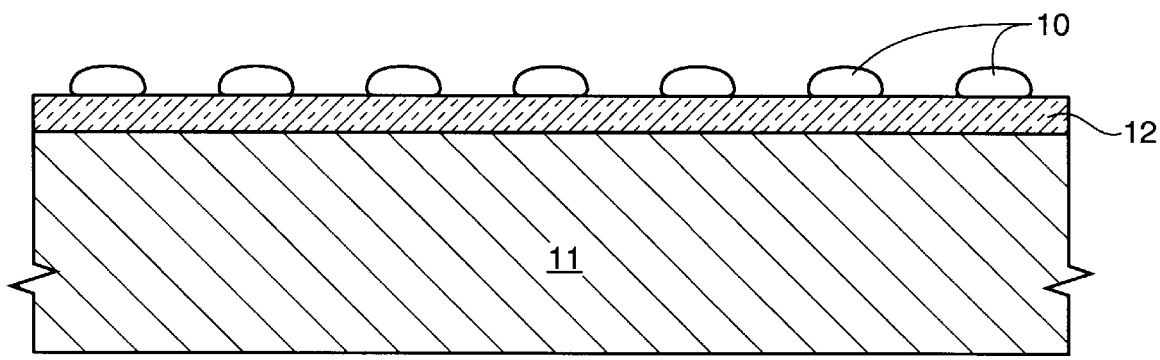
FIG. 7 is a schematic cross-section of a layered substrate having droplets disposed thereon, according to the process of the present invention.
Figure 8:
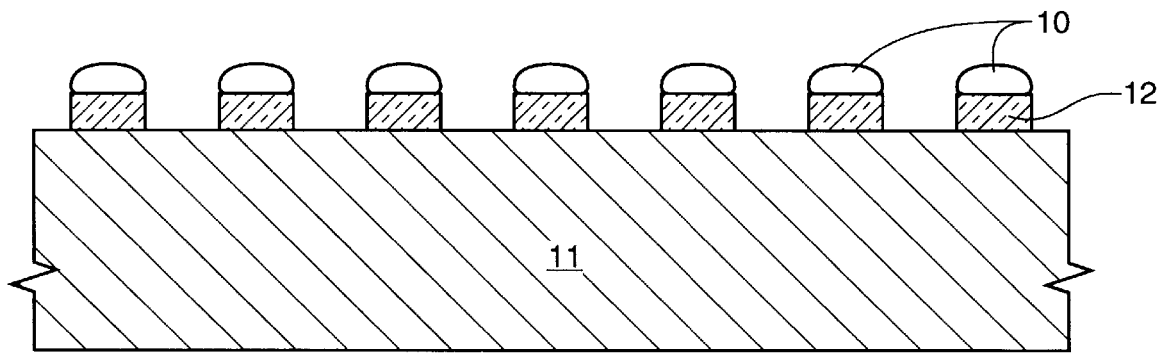
FIG. 8 is a schematic cross-section of the layered substrate of FIG. 7, after the masking layer has been etched, according to the process of the present invention.
Figure 9:
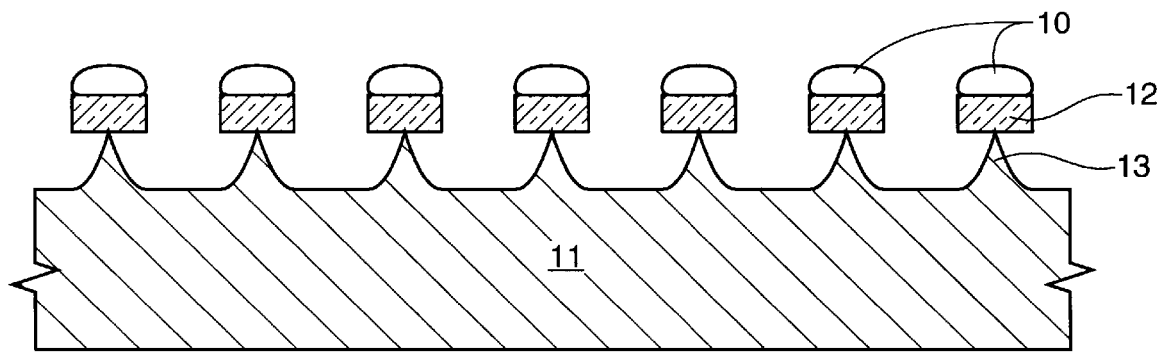
FIG. 9 is a schematic cross-section of the layered substrate of FIG. 8, after an isotropic etch, according to the process of the present invention.

FIGS. 5A and 5B, depict an apparatus capable of generating a charged liquid cluster beam. The surface of the photoresist 2A is charged so that the electrical tension force at a particular site is greater than the overall surface tension. At this point, the liquid at the site is expelled from the reservoir 9A through the capillary nozzle 8.

The apparatus comprises the reservoir area 9A, the trajectory area 9B, and substrate unit 9C. The reservoir area 9A comprises a nozzle 8 which contains a capillary tube 8 into which is dispensed the photoresist 2A and a metal electrode 8B. The electrode 8A functions to impart a charge onto the liquid 2A at the end of the capillary tube 8. The electrode functions as cathode when charged by the voltage source 20.

The trajectory area 9B is that portion of the apparatus where the stream of charged droplets 2A is directed electromagnetically (e.g., using magnets on the chamber) or heated (e.g., by inputting a heated gas into the chamber).

The substrate unit 9C is the location where the substrate 5 or wafer is mounted. The substrate unit 9C may be charged with a voltage, or alternatively heated, thereby attracting the charged droplets 2A to the surface thereof.

See, for example, "Generation of Charged Liquid Cluster Beam of Liquid-Mix Precursors and Application to Nanostructured Materials," Nanostructured Materials, Vol. 4, No. 5, pp597–602, 1994 by K. Kim and C. K. Ryu, in which this apparatus is more fully described. This reference is incorporated herein by reference to demonstrate the state of the art.

Since the expelled liquid 2A contains an electrostatic charge, its trajectory can be directed or "written." In this manner, a pattern can be imparted to a substrate 5. Portions of the substrate 5 can also be electrostatically charged with a voltage opposite that of the charged droplets 2A. In this way, path of the droplets is directed toward specific areas of the substrate 5.

For illustrative purposes, the process of the present invention is described with reference to field emission displays (FED), shown in FIG. 6. The patterning and masking aspects of the process of the present invention are well-suited for the fabrication of the very sharp cathode emitter tips 13 used in such devices.

FIG. 6 depicts the array of tips 13 in an illustrative field emission display device. At a field emission site, a micro-cathode 13 has been constructed on top of the substrate 11. Surrounding the micro-cathode 13, is a grid structure 15. When a voltage differential, through source 20, is applied between the cathode 13 and the grid 15, a stream of electrons 17 is emitted toward a phosphor coated anode screen 16.

In the preferred embodiment, the electron emission tip 13 is integral with substrate 11, and serves as a cathode. Alternatively, tip 13 can be disposed on a variety of layered and non-layered substrates and materials. Gate 15 serves as a grid structure for applying an electrical field potential to its respective cathode 13. A dielectric insulating layer 14 is deposited on the conductive cathode 13. The insulator 14 also has an opening at the field emission site location.

Disposed between said faceplate 16 and said baseplate 21 are located spacer support structures 18 which function to support the atmospheric pressure which exists on the electrode faceplate 16 as a result of the vacuum which is created between the baseplate 21 and faceplate 16 for the proper functioning of the emitter tips 13.

In the etching of cathode tips 13, it is particularly important to have uniform circular etch masks 12. The clarity, or resolution, of a field emission display is a function of a number of factors, including emitter tip 13 sharpness and uniformity of the tip array.

In the preferred embodiment of the present invention, a substrate 11 of 14–21 ohms-cms P-type 1-0-0 single crystal silicon is the material from which the tips 13 are formed, although other etchable substrates can be used. The mask 12, in the preferred embodiment, has a circular shape, and is comprised of 0.1 $\mu$m thick thermal silicon dioxide with a diameter of 1 $\mu$m.

In this example, the photoresist droplet 10 is used to pattern the silicon dioxide layer 12, which layer 12 will ultimately function as the hard etch mask 12 during the tip etching step. The photoresist droplets 10 are preferably removed after the pattern has been transferred to the silicon dioxide layer 12 via an etch step. See, for example, FIGS. 6, 7, and 9.

Figure 10:
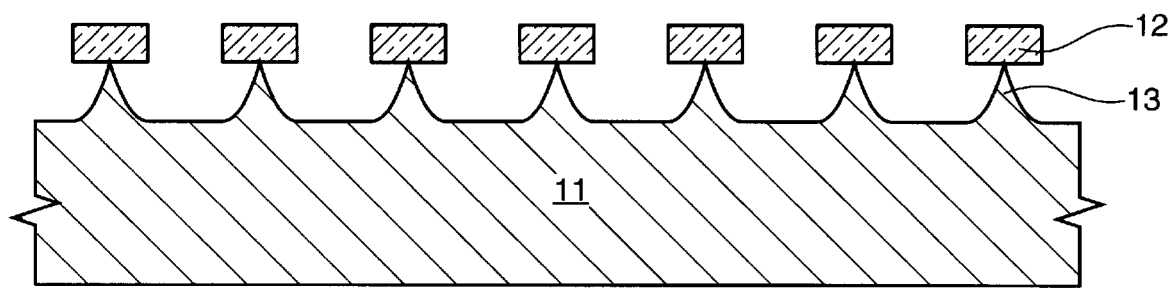
FIG. 10 is a schematic cross-section of the layered substrate of FIG. 8, after the droplets have been removed, according to an alternative embodiment of the present invention.
Figure 11:
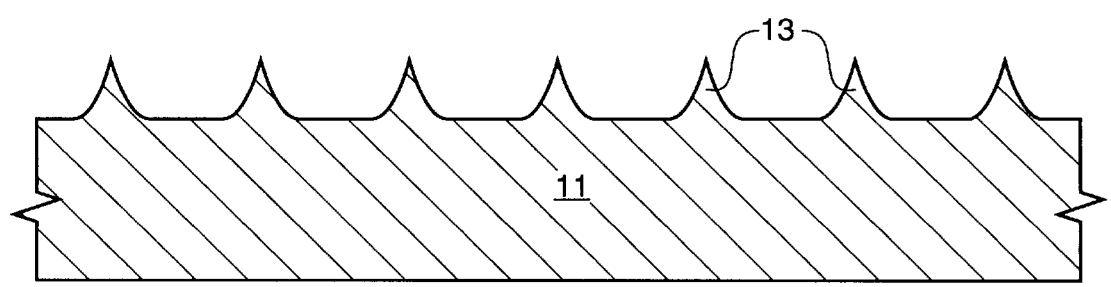
FIG. 11 is a schematic cross-section of the layered substrates of FIGS. 9 and 10, after the masking layer has been removed, according to the process of the present invention.

Alternatively, the photoresist dots 10 or droplets can remain on the silicon dioxide mask 12, during the tip etch. The mask pads 12 are etched away. When the mask pads 12 become very small or are eliminated, the micro-dots 10 are dislodged from their respective positions. When the masks 12 have been cleared, the etchant, micro-dots 10, and material from the masks 12 are removed from the etch chamber. FIG. 10 depicts the substantially uniform array of emitter tips 13 formed by the process of the present invention.

Once the patterning step has been accomplished, according to the process of the present invention, the tips structures 13 are etched. One method is taught in U.S. Pat. No. 5,391,259, in which the silicon dioxide mask 12 will adhere to the emitter tip 13 and can be overetched, beyond full undercut, without adversely effecting tip 13 shape and uniformities.

In the preferred embodiment, a dry etch to form the tip 4a proceeds for about 2.3 minutes to undercut the mask 12 and form a sharp tip 13. The tip 13 is etched vertically, as well as horizontally, and the shapes are most uniform in appearance when the rate of horizontal etching is within a factor of four to the vertical, with the most uniform results occurring after a 2:1 ratio of vertical to horizontal etching rate.

While the particular process as herein shown and disclosed in detail is fully capable of obtaining the objects and advantages herein before stated, it is to be understood that it is merely illustrative of the presently preferred embodiments of the invention and that no limitations are intended to the details of construction or design herein shown other than as described in the appended claims.

For example, one having ordinary skill in the art of etch masks will realize that the process of the present invention is equally useful for patterning spacer structures used in flat panel displays. Additionally, the process of the present invention is contemplated for patterning other submicron features used in semiconductor or other processing which requires a substantially uniform array of circular masks.

What is claimed is:

1. A physical patterning process, useful for selectively etching a substrate, said process comprising:

electrostatically charging liquid droplets, wherein said substrate has an electrical charge, said electrical charge being opposite of said electrostatic charge on said liquid droplets, said droplets being selectively etchable with respect to said substrate, said droplets having a diameter, said diameter remaining relatively constant;

dispersing said charged liquid droplets onto said substrate in a pattern; and etching said substrate using said charged liquid droplets as a mask.

2. A physical patterning process, useful for selectively etching a substrate, said process comprising:

electrostatically charging liquid droplets, said droplets being selectively etchable with respect to said substrate, said droplets having a diameter, said diameter remaining relatively constant, wherein said liquid droplets comprise photoresist;

dispersing said charged liquid droplets onto said substrate in a pattern; and etching said substrate using said charged liquid droplets as a mask.

3. The physical patterning process, according to claim 2, wherein said substrate has an electrical charge, said electrical charge being opposite of said electrostatic charge on said liquid droplets.

4. A physical patterning process, useful for selectively etching a substrate, said process comprising:

electrostatically charging liquid droplets, said droplets being selectively etchable with respect to said substrate, said droplets having a diameter, said diameter remaining relatively constant;

dispersing said charged liquid droplets onto said substrate in a pattern, wherein said pattern comprises an array; and etching said substrate using said charged liquid droplets as a mask.

5. A method of masking a substrate, said method comprising:

spraying liquid droplets onto said substrate, thereby patterning said substrate, wherein said liquid droplets comprise photoresist, each of said droplets being substantially circular and having the same approximate diameter, said diameter remaining substantially constant; and selectively etching portions of said substrate unpatterned by said droplets.

6. The method of masking a substrate, according to claim 5, wherein said diameter of said droplets is less than 1 $\mu$m.

7. The method of masking a substrate, according to claim 5, wherein said substrate is a multi-layered substrate, said portions of said substrate comprising a hard mask material.

8. A method of masking a substrate, wherein said substrate is a multi-layered substrate, said portions of said substrate comprising a hard mask material; said method comprising:

spraying droplets onto said substrate, thereby patterning said substrate, each of said droplets being substantially circular and having the same approximate diameter, said diameter remaining substantially constant, wherein said diameter of said droplets is less than 1 $\mu$m;

removing said droplets from said hard mask material after said portions of said substrate have been etched; and isotropically etching said substrate through said hard mask material.

9. The method of masking a substrate, according to claim 5, wherein said droplets comprise a liquid component and a solid component.

10. The method of masking a substrate, according to claim 5, wherein said droplets are sprayed in a drying ambient, thereby causing said droplets to solidify into beads.

11. A method of masking a substrate, said method comprising:

spraying droplets onto said substrate, wherein said droplets are sprayed through a shadow mask, said droplets being sprayed in a drying ambient, thereby causing said droplets to solidify into beads, thereby patterning said substrate, each of said droplets being substantially circular and having the same approximate diameter, said diameter remaining substantially constant; and selectively etching portions of said substrate unpatterned by said droplets.

12. The physical patterning process, according to claim 1, wherein said droplets are sprayed in a drying ambient, thereby causing said droplets to solidify into beads.

13. A physical patterning process, useful for selectively etching of a substrate, said process comprising:

electrostatically charging liquid droplets, said droplets being selectively etchable with respect to said substrate;

dispersing said charged liquid droplets onto said substrate in a pattern, wherein said liquid droplets comprise photoresist; and isotropically etching said substrate using said charged liquid droplets as a mask.

14. The physical patterning process, according to claim 13, wherein said substrate has an electrical charge, said electrical charge being opposite of said electrostatic charge on said liquid droplets.

15. A physical patterning process, useful for selectively etching of a substrate, said process comprising:

electrostatically charging liquid droplets, said droplets being selectively etchable with respect to said substrate;

dispersing said charged liquid droplets onto said substrate in a pattern, wherein said pattern comprises an array; and isotropically etching said substrate using said charged liquid droplets as a mask.

16. A physical patterning process, useful for selectively etching a substrate, said process comprising:

electrostatically charging droplets, said droplets being selectively etchable with respect to said substrate, said substrate having an electrical charge, said electrical charge being opposite of said electrostatic charge on said liquid droplets, said droplets having a liquid component and a solid component, said solid component having a diameter, said diameter remaining relatively constant;

spraying said charged droplets onto said substrate in a pattern; and etching said substrate using said charged droplets as a mask.

17. A method of masking a substrate, said method comprising:

spraying droplets onto said substrate, said droplets having a liquid component and a solid component, said solid component comprising beads, said beads having a diameter;

subjecting said droplets to a drying ambient, thereby removing said liquid component, said diameter of said beads remaining substantially constant;

patterning said substrate, wherein said pattern comprises an array; and selectively etching portions of said substrate unpatterned by said droplets.

* * * * *